US009237652B2

(12) United States Patent
Yuen et al.

(10) Patent No.: US 9,237,652 B2
(45) Date of Patent: Jan. 12, 2016

(54) FLEXIBLE LED SCREEN

(76) Inventors: Ronald Sik Hung Yuen, Hong Kong (HK); Haoran Wang, Shenzhen (CN)

( * ) Notice: Subject to any disclaimer, the term of this patent is extended or adjusted under 35 U.S.C. 154(b) by 740 days.

(21) Appl. No.: 12/142,778

(22) Filed: Jun. 20, 2008

(65) Prior Publication Data

US 2008/0316153 A1 Dec. 25, 2008

(30) Foreign Application Priority Data

Jun. 22, 2007 (CN) ...................... 2007 2 0120960 U

(51) Int. Cl.
*G09G 3/30* (2006.01)
*H05K 1/18* (2006.01)
*G09F 9/33* (2006.01)

(52) U.S. Cl.
CPC .................. *H05K 1/181* (2013.01); *G09F 9/33* (2013.01); *H05K 1/189* (2013.01); *H05K 2201/105* (2013.01); *H05K 2201/10106* (2013.01); *H05K 2201/10689* (2013.01); *H05K 2203/1572* (2013.01)

(58) Field of Classification Search
CPC .................. H05K 1/181; H05K 1/189; H05K 2201/10106; H05K 2201/105; H05K 2201/10689; H05K 2203/1572
USPC ........................................................... 345/76
See application file for complete search history.

(56) References Cited

U.S. PATENT DOCUMENTS

| 6,290,713 | B1 * | 9/2001 | Russell ............................ 607/88 |
| 2004/0138726 | A1 * | 7/2004 | Savage et al. ................... 607/88 |
| 2006/0139902 | A1 | 6/2006 | Happoya |
| 2006/0225914 | A1 | 10/2006 | Tan |
| 2007/0208397 | A1 * | 9/2007 | Gardner ........................ 607/88 |

OTHER PUBLICATIONS

Extended European Search Report of counterpart patent application.
Partial European Search Report of counterpart patent application.

* cited by examiner

*Primary Examiner* — Jonathan Boyd

(57) ABSTRACT

A flexible LED screen includes a flexible printed circuit board having a front surface and a rear surface, a plurality of SMT-LEDs mounted on the front surface of the flexible printed circuit board, and a plurality of integrated circuits mounted on the rear surface of the flexible printed circuit board.

7 Claims, 6 Drawing Sheets

FLEXIBLE LED SCREEN

CROSS-REFERENCE OF RELATED APPLICATION

This patent application claims priority of Chinese Utility Model Application No. 200720120960.7 filed on Jun. 22, 2007.

FILED OF PATENT APPLICATION

The present patent application relates to a flexible light-emitting diode (LED) screen.

BACKGROUND

A conventional LED display screen is usually formed of a rigid printed circuit board (PCB) and a plurality of conventional light-emitting diodes (LEDs) with elongated pins that are insertable through holes formed on the PCB.

A conventional LED is a solid-state semiconductor light-emitting device. It utilizes a solid-state semiconductor chip as the light-emitting material. When charge-carriers react, energy is released in the form of a photon to emit red, yellow, blue, green, cyan, orange, purple and white lights. The characteristics of LED include low drive voltage, low power consumption, uniform light intensity, fast start-up, firm and durable structure, resistance to shock and vibration, reliable performance, lightweight, small size, and low in costs. By means of the LEDs, a LED display can be employed to display messages and decorate the environment.

FIG. 1a is a conventional LED display screen 1. The LED display screen 1 is an assembly of a plurality of LED display modules 2. Each display module 2 includes a rigid printed circuit board and integrated circuits. FIG. 1b is a cross sectional view of a conventional LED. It has components 5, 6 with pins 7 inserted through holes formed on the printed circuit board 3.

According to fixed pitch and number, LEDs are arranged into a LED matrix. The anodes and cathodes are connected together accordingly, and are then connected to external lead pins so as to facilitate the assembly of the LED display screen.

FIG. 2a is a front view of a commercially available 8×8 LED display module 8 (2088AEG). FIG. 2b shows a circuit diagram of the 8×8 LED display module 8 of FIG. 2a.

One of the disadvantages of conventional LED display screens is that they are large, thick and heavy. For example, a 1 m2 8×8 LED display module 8 (2088AEG) weighs about 24.6 Kg. Strong and heavy frames or supports are needed to support these LED display screens to ensure safety in the assembling process. The thickness of a conventional LED display screen is in the range of 5 cm and 50 cm. This kind of LED display screen is not suitable for installation in small space environments. Also, the conventional LED display screens are rigid and not flexible. These conventional LED display screens are made of rigid PCB and can only be mounted on flat surfaces.

Conventional LED display module is normally square in shape, and is limited in the choice of LED color and LED matrix. Longer delivery time and higher tooling expenses are incurred in order to produce customized LED display screen with special LED color, matrix and shape.

Furthermore, conventional LED 4 as shown in FIG. 3 has a generally cylindrical housing 9 which obstructs the emission of LED light from the LED 4. LED light emits from a conventional LED at a narrow angle of about 110 degrees.

Therefore, there is a need to provide an improved LED display system.

SUMMARY

A flexible LED screen includes a flexible printed circuit board having a front surface and a rear surface, a plurality of SMT-LEDs mounted on the front surface of the flexible printed circuit board, and a plurality of integrated circuits mounted on the rear surface of the flexible printed circuit board.

The flexible printed circuit board may includes a base film having two opposite surfaces, two copper foils respectively adhered to the two opposite surfaces of the film base, and two coverlays respectively adhered to the two copper foils.

The base film of the flexible printed circuit board may have a thickness ranging from about 0.0254 mm to about 0.0512 mm. The copper foil of the flexible printed circuit board may have a thickness ranging from about 0.01778 mm to about 0.07112 mm. The coverlay of the flexible printed circuit board may have a thickness ranging from about 0.0254 mm to about 0.0512 mm. The copper foils are adhered to the film base by an adhesive having a thickness ranging from about 0.01016 mm to about 0.0254 mm. The coverlays are adhered to the copper foils by an adhesive having a thickness ranging from about 0.0127 mm to about 0.03556 mm.

In one embodiment, the flexible LED screen may further include a front louver layer coupled to the front surface of the flexible printed circuit board. The front louver includes a plurality of openings sized and shaped to allow the SMT-LEDs to situate therein. The front louver layer may be made of silicon rubber or silicon dioxide and may have a thickness of about 2.8 mm.

In one embodiment, the flexible LED screen may further include a front foam layer sandwiched between the flexible printed circuit board and the front louver layer. The front foam layer may be made of silicon rubber and may have a thickness of about 3.5 mm.

In one embodiment, the flexible LED screen may further include a fixation layer coupled to a rear surface of the flexible printed circuit board to facilitate the fixing of the flexible LED screen to a support structure. The fixation layer includes a plurality of openings sized and shaped to allow the integrated circuits to situate therein. The fixation layer may be made of magnetic rubber and may have a thickness of about 1.5 mm.

In one embodiment, the flexible LED screen may further include a rear foam layer sandwiched between the flexible printed circuit board and the fixation layer. The rear foam layer may be made of silicon rubber and may have a thickness of about 3.5 mm.

BRIEF DESCRIPTION OF THE DRAWINGS

Specific embodiments of the flexible LED screen disclosed in the present application will now be described by way of example with reference to the accompanying drawings wherein:

FIG. 1b is a cross sectional view of the prior art LED screen of FIG. 1a;

FIG. 2a is a front view of an 8×8 LED display module of the prior art LED careen of FIG. 1a;

FIG. 2b is a circuit diagram of the LED display module of FIG. 2a;

FIG. 8b is a perspective view of the front louver layer of FIG. 8a;

DETAILED DESCRIPTION

Reference will now be made in detail to embodiments of the flexible LED screen disclosed in the present patent application, examples of which are also provided in the following description. Exemplary embodiments of the flexible LED screen disclosed in the present patent application are described in detail, although it will be apparent to those skilled in the relevant art that some features that are not particularly important to an understanding of the flexible LED screen may not be shown for the sake of clarity.

Furthermore, it should be understood that the flexible LED screen disclosed in the present patent application is not limited to the precise embodiments described below and that various changes and modifications thereof may be effected by one skilled in the art without departing from the spirit or scope of the appended claims. For example, elements and/or features of different illustrative embodiments may be combined with each other and/or substituted for each other within the scope of this disclosure and appended claims.

It should be noted that throughout the specification and claims herein, when one element is said to be "coupled" to another, this does not necessarily mean that one element is fastened, secured, or otherwise attached to another element. Instead, the term "coupled" means that one element is either connected directly or indirectly to another element or is in mechanical or electrical communication with another element.

Figure 4:
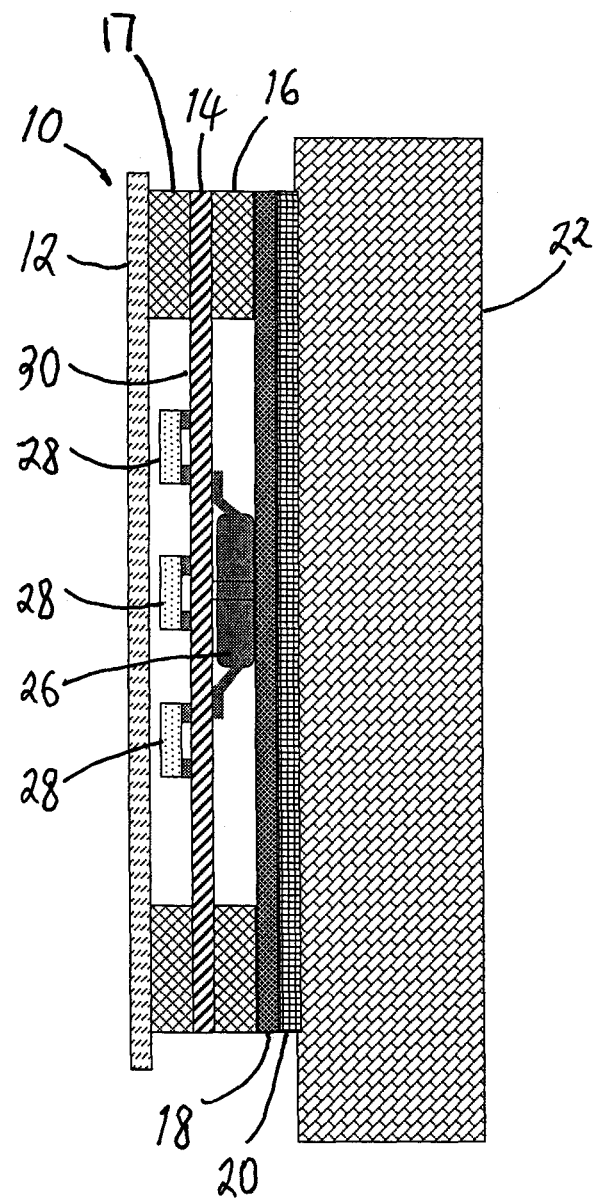
FIG. 4 is a cross sectional view of a flexible LED screen according to an embodiment disclosed in the present patent application.

FIG. 4 is a cross sectional view of the flexible LED screen 10 according to an embodiment disclosed in the present patent application. The flexible LED screen 10 includes a core layer 14, light emitting diodes (LEDs) 28, and integrated circuits 26. The flexible LED screen 10 may also includes a front louver layer 12, a front foam layer 17, a rear foam layer 16, and a fixation layer 18 for fixing the flexible LED screen 10 to an iron sheet 20 on a wall 22.

Figure 5:
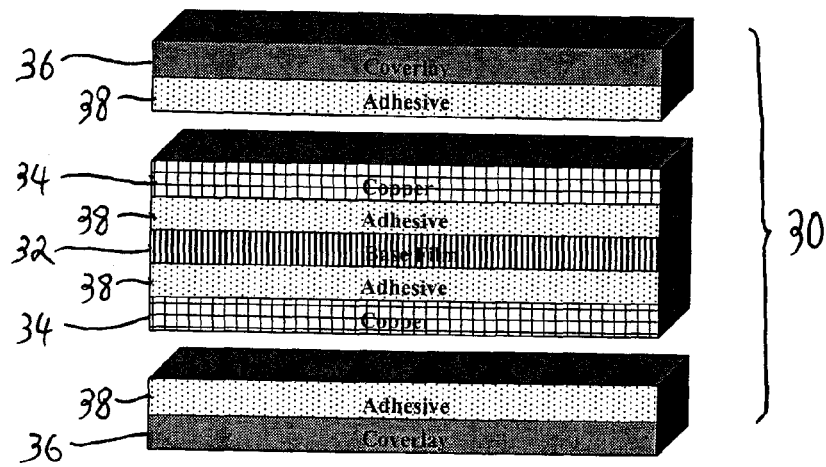
FIG. 5 is an illustrative diagram of a flexible printed circuit board of the flexible LED screen according to an embodiment disclosed in the present application.

The core layer 14 includes a flexible printed circuit (FPC) board 30 (as shown in FIG. 5) on which the LEDs 28 and the integrated circuits 26 are mounted.

FIG. 5 is an illustrative diagram depicting the flexible printed circuit board 30 of the flexible LED screen 10 according to an embodiment disclosed in the present patent application.

The flexible printed circuit board 30 includes of a base film 32 having two opposite surfaces, two roll-pressed copper foils 34 respectively adhered to the two opposite surfaces of the film base 32, and two coverlays 36 respectively adhered to the two copper foils 32.

The base film 32 may be made of polymide (PI) or any suitable insulating materials. Polymide is known for its heat resistance and flame retardance characteristics. If heat resistance is not a concern, then polyester (PET) may be selected as the material for manufacturing the base film 32. The base film 32 may have a thickness ranging from about 0.0254 mm to about 0.0512 mm. Preferably, the base film 32 has a thickness of about 0.0381 mm.

The two copper foils 34 are adhered on the two opposite surfaces of the base film 32 respectively by adhesive 38. The copper foils 34 may have a thickness ranging from about 0.01778 mm to about 0.07112 mm. Preferably, the copper foils 34 have a thickness of about 0.03556 mm. The copper foils 34 can pass a bending test of up to 10,000 times of bending without breaking. The copper foils 34 can be formed into electrical circuits by an etching process, and serve as electrical connections for electrical components of the flexible LED screen 10. Stiffeners (not shown) made of the same material as the base film 32 may be formed on the base film 32 in the areas not covered by the copper foils 34 for stiffening purposes. It is understood that the stiffeners would not increase the thickness of the flexible printed circuit board 30.

The adhesive 38 may be made of acrylic, epoxy resin, or any other suitable materials. The adhesive 38 may have a thickness ranging from about 0.01016 mm to about 0.0254 mm. Preferably, the adhesive 38 has a thickness of about 0.0254 mm.

The two coverlays 36 may be made of polymide (PI), polyester (PET), or any other suitable materials. The coverlays 36 may have a thickness ranging from about 0.0254 mm to about 0.0512 mm. Preferably, the coverlays 36 has a thickness of about 0.0254 mm. The two coverlays 36 may be adhered on the two outer surfaces of the two adhered copper foils 34 respectively by adhesive 38. The adhesive 38 may be made of acrylic, epoxy resin, or any other suitable materials. The adhesive 38 for adhering the coverlays 36 to the copper foils 34 may have a thickness ranging from about 0.0127 mm to about 0.03556 mm. Preferably, the adhesive 38 has a thickness of about 0.0127 mm. The coverlays 36 cover the adhesive 38 and serve to protect the flexible printed circuit board 30.

The thickness of the flexible printed circuit board 30 may be about 0.27 mm, which is much thinner than a conventional printed circuit board which usually has a thickness of about 1.6 mm. However, the flexible printed circuit board 30 has the same electrical properties and processability as the conventional printed circuit board. The flexible printed circuit board 30 is characterized in that it is thin, light-weight, and can be assembled into a three dimensional LED display structure.

Several flexible printed circuit boards 30 are interconnected together and wired up to form an entire LED display system for displaying messages.

Figure 6:
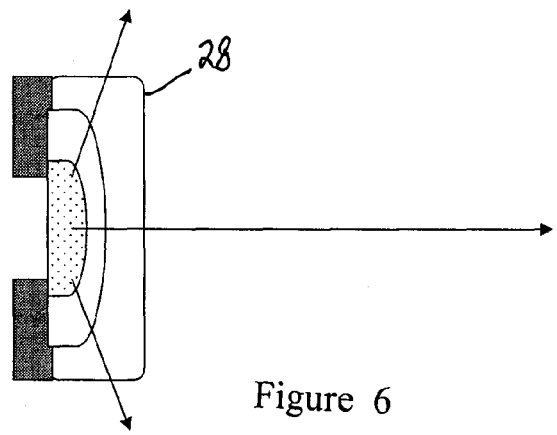
FIG. 6 is an illustrative diagram showing the transmission of light from a surface-mount LED according to an embodiment disclosed in the present application.

FIG. 6 is an illustrative diagram showing the transmission of light from a surface-mounting LED according to an embodiment disclosed in the present application.

The LEDs 28 are mounted on the front surface of the flexible printed circuit board 30 by surface mount technology (SMT). This kind of LED is termed as SMT-LED. The SMT-LED 28 may be a single basic color SMT-LED, or a double basic color SMT-LED, or a full color (3 colors) SMT-LED. These SMT-LEDs are much smaller in size and lighter in weight than conventional LEDs. Furthermore, the SMT- LEDs 28 are relatively flat and low profile as compared to conventional LEDs that have relatively large housings and elongated pins. This can greatly reduce the size and thickness of the Flexible LED screen 10. The SMT-LEDs 28 and the flexible printed circuit board 30 may have a total thickness of about 3 mm.

A programmed machine is employed to pick and precisely place the SMT-LEDs 28 on the flexible printed circuit board 30. The flexible printed circuit board 30 is provided with solder pads that align with connections provided on the SMT-LEDs 28 to be mounted, and the programmed machine places the SMT-LEDs precisely over the solder pads during the manufacturing process. Once the SMT-LEDs 28 are placed in contact with the solder pads, heat is applied to the flexible printed circuit board 30 to a reflow temperature.

Figure 1A:
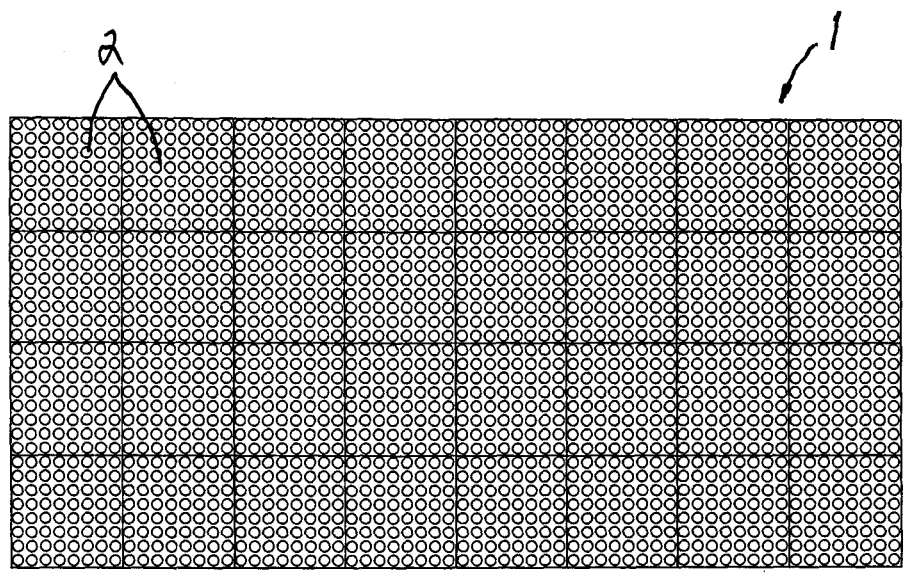
FIG. 1a is a prior art LED screen.
Figure 1B:
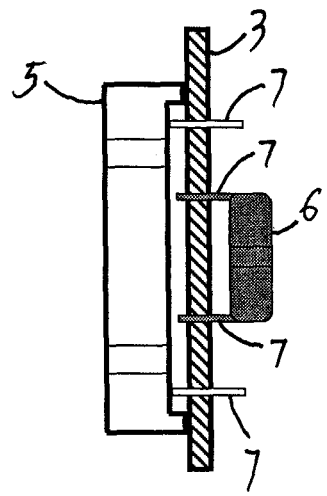
Figure 2A:
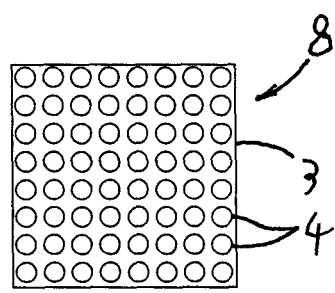
Figure 2B:
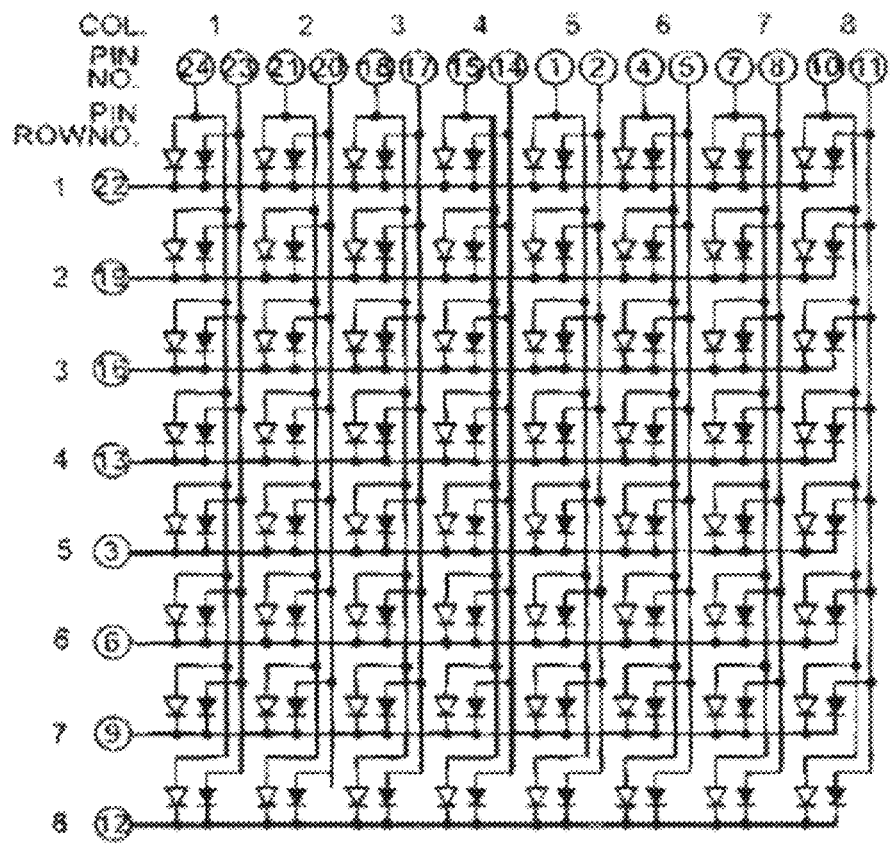
Figure 3:
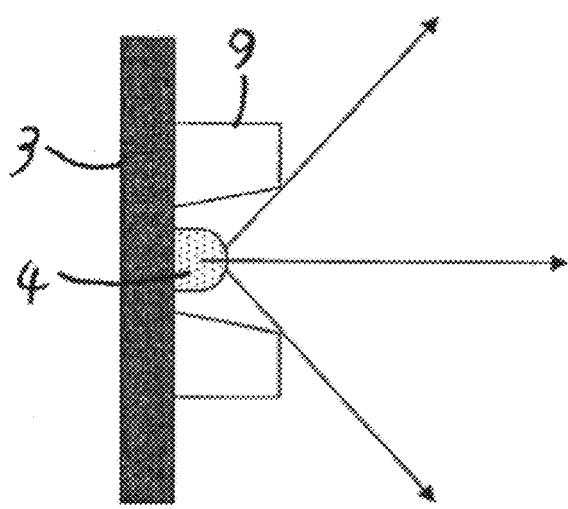
FIG. 3 is an illustrative diagram showing the transmission of light from an LED according to the prior art.

A LED display with SMT-LEDs can produce a more uniform light intensity and a wider LED light angle than a LED screen with conventional LEDs, as illustrated in FIGS. 3 and 6. The LED screen 10 of the present patent application can meet different customers' requirements on the layout, colors, shapes and configurations of a LED display screen by simply adjusting the flexible printed circuit board 30. According to the selection of SMT-LEDs, single basic color SMT-LED displays, double basic color SMT-LED displays, or full color SMT-LED displays can be produced.

The LEDs 28 and the integrated circuits 26 are mounted on the front and rear surfaces of the flexible printed circuit board 30 respectively by surface mount technology.

Figure 7:
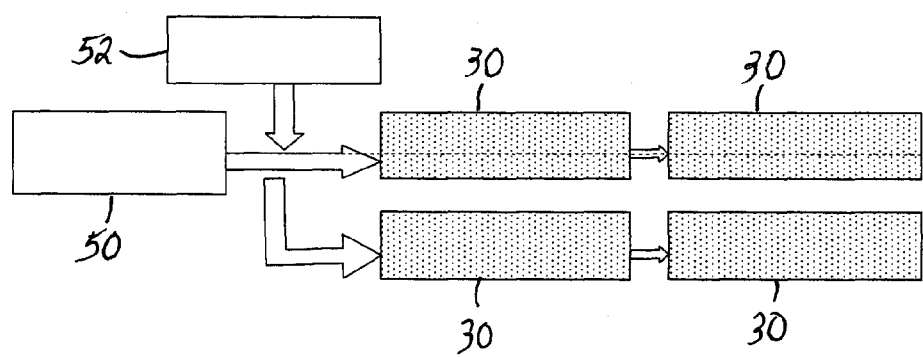
FIG. 7 is a block diagram showing the LED display system according to an embodiment disclosed in the present application.

FIG. 7 is a block diagram showing the LED display screen system according to an embodiment disclosed in the present application.

The LED display screen system includes the flexible printed circuit board 30, a signal processing unit 50 and a power supply unit 52. The power source from the power supply unit 52 may be AC-DC power source having an output voltage range between about +3.3V and about +15V. For particular environments such as automobiles, DC-DC power source having an output voltage range between about +3.3V and about +15V may be applied.

The signal processing unit 50 serves as a control center of the LED screen 10. It records messages entered through computers, keyboards, remote controls, or wireless transmissions. The signal processing unit 50 converts the messages to digital signals, and then transmits the digital signals to the SMT-LEDs of the flexible printed circuit board 30 where the text messages, graphs, videos, etc. are displayed. The signal processing unit 50 may be in the form of a computer or a single chip microcomputer depending on the size of the data to be processed.

Figure 8A:
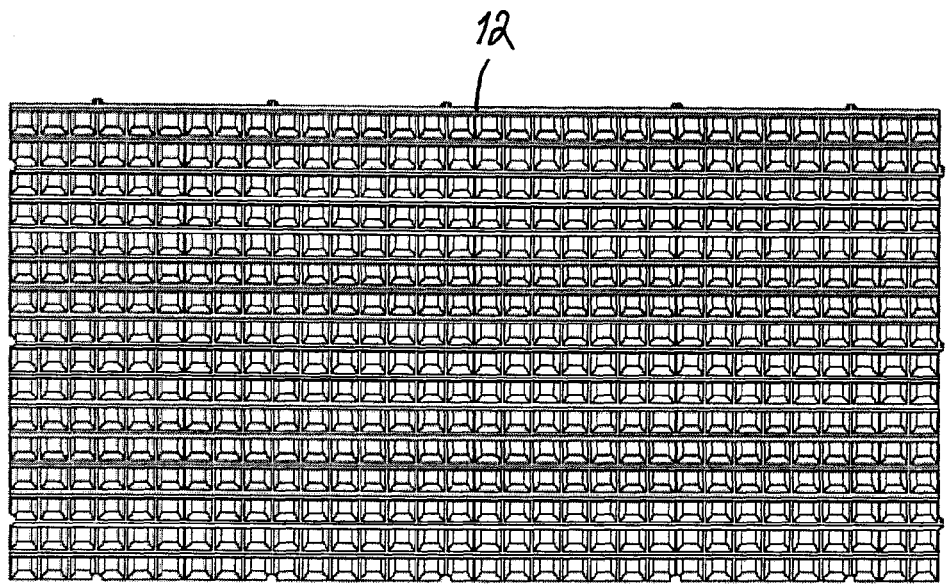
FIG. 8a is a front view of a front louver layer of the flexible LED screen according to an embodiment disclosed in the present application.
Figure 8B:
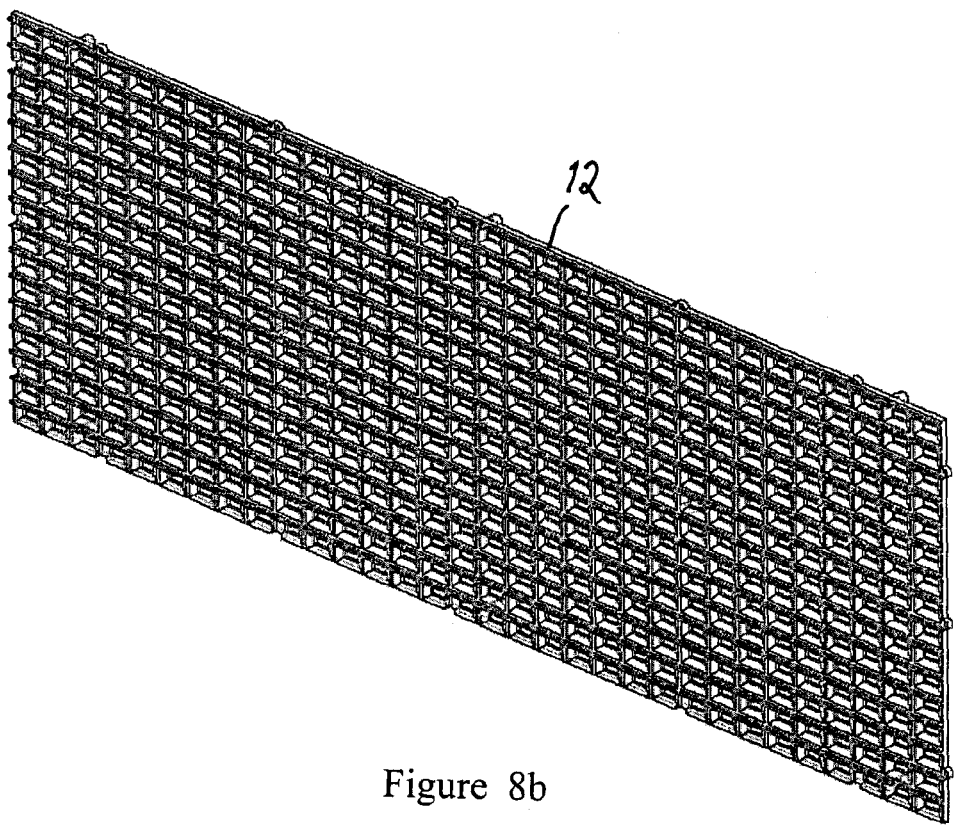

FIGS. 8a and 8b are the front and perspective views respectively of the front louver layer 12 of the flexible LED display according to an embodiment disclosed in the present application.

The front louver layer 12 may be made of silicon rubber, or silicon dioxide, or any other suitable materials. The front louver layer 12 may have a thickness of about 2.8 mm. The front louver layer 12 may be coupled to the LED-mounting side of the flexible printed circuit board 30, and serves to protect the flexible printed circuit board 30 and the SMT-LEDs 28. The front louver includes a plurality of openings sized and shaped to allow the SMT-LEDs to situate therein. The front louver layer 12 also gives the LED display a better outer appearance.

Figure 9:
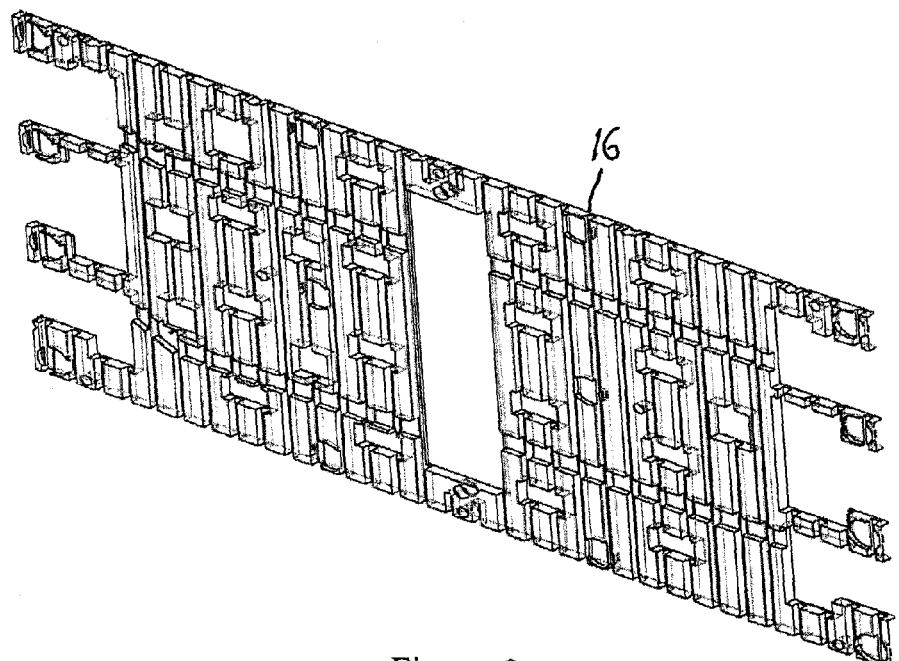
FIG. 9 is a perspective view of a rear foam layer of the flexible LED screen according to an embodiment disclosed in the present application.

FIG. 9 is a perspective view of the rear foam layer 16 of the flexible LED screen 10 according to an embodiment disclosed in the present application.

The foam layer may be made of silicon rubber and may have a thickness of about 3.5 mm. The foam layer may be attached to the front and/or rear surfaces of the flexible printed circuit board 30 by adhesive means. The front foam layer 17, which is attached to the front surface of the flexible printed circuit board 30, includes a plurality of openings sized and shaped to allow the SMT-LEDs to situate therein. The front louver layer 12 may then be attached to the front foam layer 17, as depicted in FIG. 4. The rear foam layer 16, which is attached to the rear surface of the flexible printed circuit board 30, includes a plurality of openings sized and shaped to allow the integrated circuits to situate therein. The fixation layer 18 may then be attached to the rear foam layer 16, as depicted in FIG. 4. The foam layer serves to protect the flexible printed circuit board 30.

Figure 10:
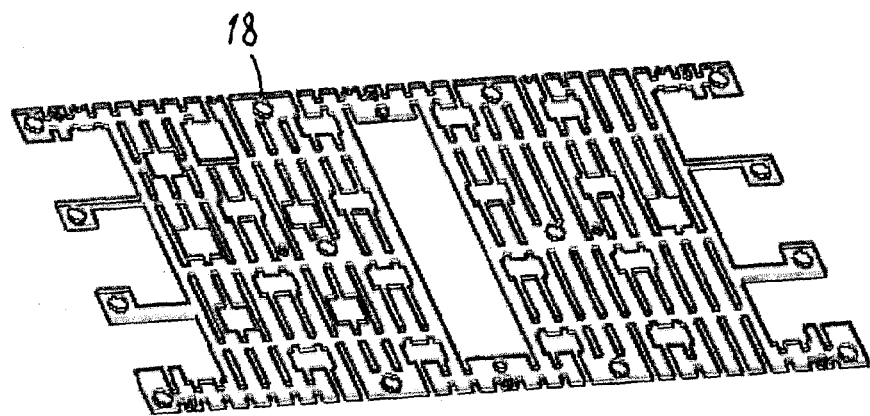
FIG. 10 is a perspective view of a fixation layer of the flexible LED screen according to an embodiment disclosed in the present application.

FIG. 10 is a perspective view of the fixation layer 18 of the flexible LED screen 10 according to an embodiment disclosed in the present application.

The fixation layer 18 may be made of magnetic rubber and may have a thickness of about 1.5 mm. The fixation layer 18 includes a plurality of openings sized and shaped to allow the integrated circuits to situate therein. The fixation layer 18 serves to fix the flexible printed circuit board 30 on the wall 22 or any supporting structure.

The wall 22 can be provided with an iron sheet 20. The flexible LED screen 10 can therefore be mounted on the wall 22 by the attractive magnetic force between the iron sheet 20 and the magnetic rubber fixation layer 18 of the flexible LED screen 10. Additional powerful magnets may be provided to ensure a more secured mounting of the flexible LED screen 10 on the wall 22.

Alternately, the flexible LED screen 10 may be mounted on the wall 22 by using hook-and-loop fasteners. The wall 22 can be provided with hook/loop fastener. The flexible LED screen 10 can therefore be mounted on the wall 22 by cooperating hook/loop fastener provided on the flexible LED screen 10.

By using magnetic rubbers and hook-and-loop fasteners, the flexible LED screen 10 so designed can remain thin, lightweight, and flexible. This makes installation of the flexible LED screen 10 easy and more efficient. The LED displays 10 can be mounted on surfaces like puzzles and can be completed by wiring up the flexible printed circuit board 30. To keep the flexible LED screen 10 as thin as possible, the signal processing unit 50 and the power supply unit 52 can be disposed external to the flexible LED screen 10.

The flexible LED screen 10, including the front louver layer 12, the core layer 14, the foam layers 16 and 17, and the fixation layer 18, has a total thickness of less than 8 mm and a weight of less than 5 kg/m$^2$.

A plurality of flexible LED screen 10 can be interconnected together physically and electrically to form flexible LED screens of different sizes and shapes. The flexible LED screen 10 may be mounted on flat or curve support surfaces to form a three dimensional LED display.

The flexible LED screen 10 disclosed in the present patent application is flexible, thin, light-weight, easy to install, and provides a wider viewing angle. The flexible LED screen 10 may even expand its application in different industries such as textile, automobile, decoration, and toy industry.

While the flexible LED screen disclosed in the present application has been shown and described with particular references to a number of preferred embodiments thereof, it should be noted that various other changes or modifications may be made without departing from the scope of the appended claims.

What is claimed is:

1. A flexible LED screen comprising:
a flexible printed circuit board comprising a front surface and a rear surface;
a plurality of SMT-LEDs mounted on the front surface of the flexible printed circuit board;
a plurality of integrated circuits mounted on the rear surface of the flexible printed circuit board;
a flexible front louver array layer coupled to the front surface of the flexible printed circuit board, the flexible front louver array layer comprising a plurality of rows of evenly spaced and a plurality of columns of evenly spaced first openings sized and shaped to allow the SMT-LEDs to situate therein; wherein each of the SMT-LEDs is located at a corresponding one of the first openings, and each of the first openings corresponds to only one SMT-LED;
a flexible front foam array layer sandwiched between the flexible printed circuit board and the flexible front louver array layer, the flexible front foam array layer comprising a plurality of rows and a plurality of columns of second openings sized and shaped to allow the SMT-LEDs to situate therein;
a flexible fixation layer coupled to a rear surface of the flexible printed circuit board to facilitate the fixing of the flexible LED screen to a support structure, the flexible fixation layer comprising a plurality of third openings sized and shaped to allow the integrated circuits to situate therein; and
a flexible rear foam layer sandwiched between the flexible printed circuit board and the flexible fixation layer;
wherein the flexible printed circuit board comprises a base film comprising two opposite surfaces; two copper foils adhered to the two opposite surfaces of the film base, respectively; and two coverlays adhered to the two copper foils, respectively;
and wherein the front louver array layer, the front foam array layer and the rear foam layer are made of flexible silicon rubber.

2. The flexible LED screen as claimed in claim 1, wherein the base film comprises a thickness ranging from about 0.0254 mm to about 0.0512 mm;
the copper foil comprises a thickness ranging from about 0.01778 mm to about 0.07112 mm;
the coverlay comprises a thickness ranging from about 0.0254 mm to about 0.0512 mm;
the copper foils are adhered to the film base by an adhesive comprising a thickness ranging from about 0.01016 mm to about 0.0254 mm; and
the coverlays are adhered to the copper foils by an adhesive comprising a thickness ranging from about 0.0127 mm to about 0.03556 mm.

3. The flexible LED screen as claimed in claim 1, wherein the flexible front louver array layer comprises a thickness of about 2.8 mm.

4. The flexible LED screen as claimed in claim 1, wherein the flexible front foam array layer comprises a thickness of about 3.5 mm.

5. The flexible LED screen as claimed in claim 1, wherein the flexible fixation layer comprises magnetic rubber.

6. The flexible LED screen as claimed in claim 1, wherein the flexible fixation layer comprises a thickness of about 1.5 mm.

7. The flexible LED screen as claimed in claim 1, wherein the flexible rear foam layer comprises a thickness of about 3.5 mm.

* * * * *